United States Patent [19]
Kolz

[11] Patent Number: 5,289,133
[45] Date of Patent: Feb. 22, 1994

[54] POWER DENSITY METHODS FOR ELECTROSHOCKING

[76] Inventor: Arvin L. Kolz, 8726 W. Iliff Ave., Lakewood, Colo. 80227

[21] Appl. No.: 5,966

[22] Filed: Jan. 19, 1993

Related U.S. Application Data

[62] Division of Ser. No. 677,930, Apr. 1, 1991, Pat. No. 5,202,638.

[51] Int. Cl.$^5$ ............................................. G01N 27/08
[52] U.S. Cl. ................................. 324/444; 324/439; 324/601; 324/692; 43/9.6; 43/17.1
[58] Field of Search ............... 324/439, 444, 601, 692; 43/9.6, 17.1; 119/3

[56] References Cited

U.S. PATENT DOCUMENTS

| | | | |
|---|---|---|---|
| 2,605,742 | 8/1952 | Burkey | 119/3 |
| 2,951,979 | 9/1960 | Van Dyke | 43/17.1 X |
| 3,885,338 | 5/1975 | York | 43/17.1 |
| 4,593,648 | 6/1986 | Marzluf | 119/3 |
| 5,202,638 | 4/1993 | Kolz | 324/444 |

Primary Examiner—Kenneth A. Wieder
Assistant Examiner—Glenn W. Brown
Attorney, Agent, or Firm—Fields, Lewis, Pittenger & Rost

[57] ABSTRACT

Apparatus and method for measuring power density in an energized volume of water using either a measurement of voltage gradient or current density for use in determining optimal electrical power parameters for electrofishing, in-water electroshocking, electrical barrier control and the like. Specific probes for either measurement are disclosed. A calculator or programmed microprocessor receives measurements of current density or voltage gradient and water conductivity at a selected location within an energized liquid body and performs the mathematical operations necessary to calculate power density. Values on a graph of water conductivity, current density, voltage density and power density are used to determine how much electrical power to apply to a specific organism in a specific volume of liquid.

7 Claims, 3 Drawing Sheets

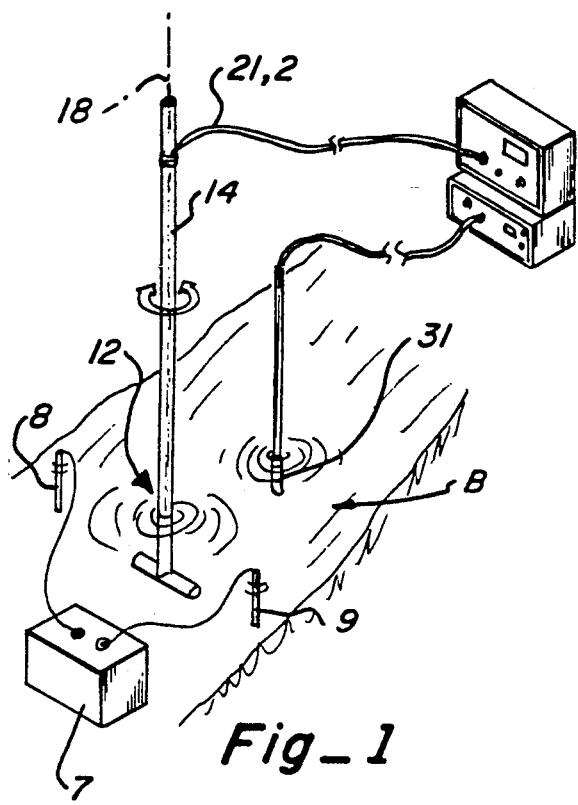
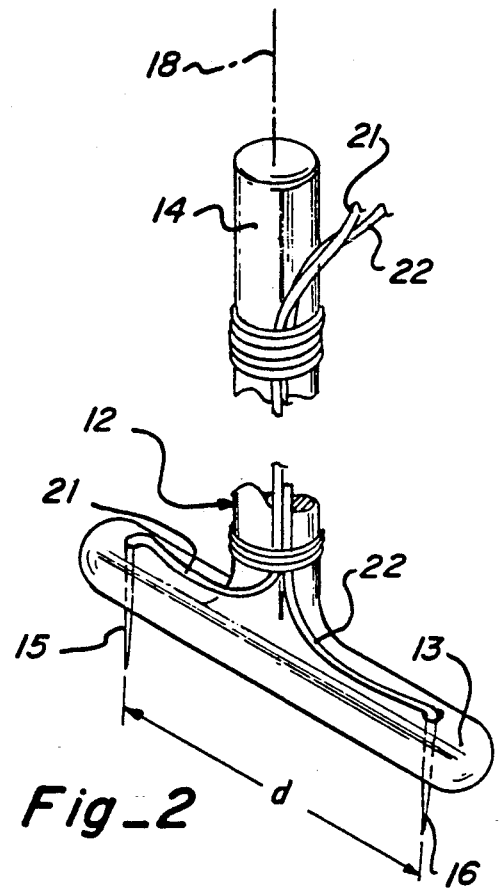
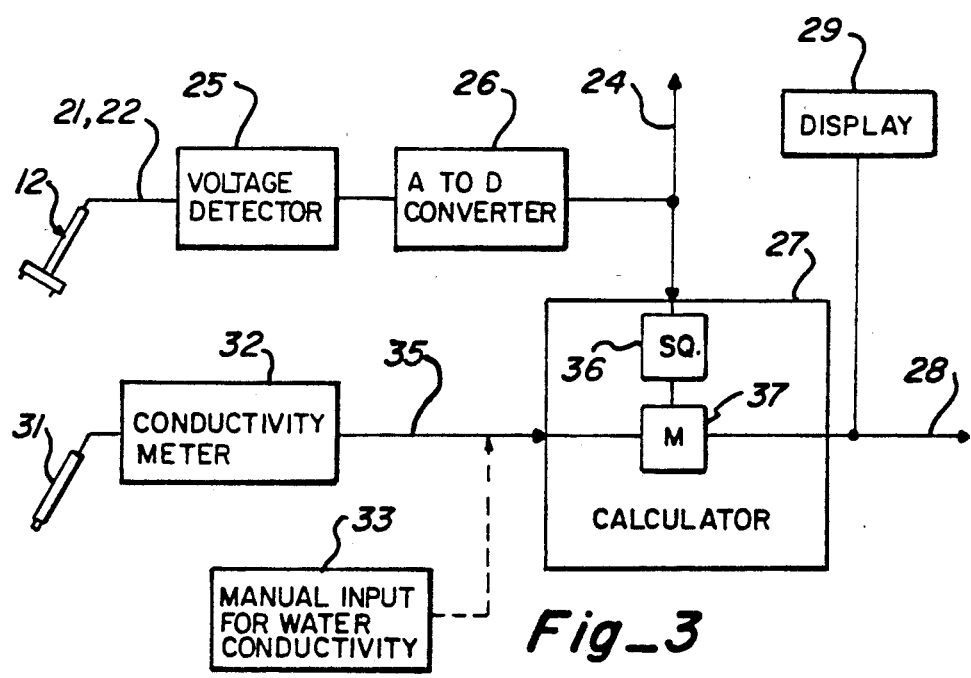

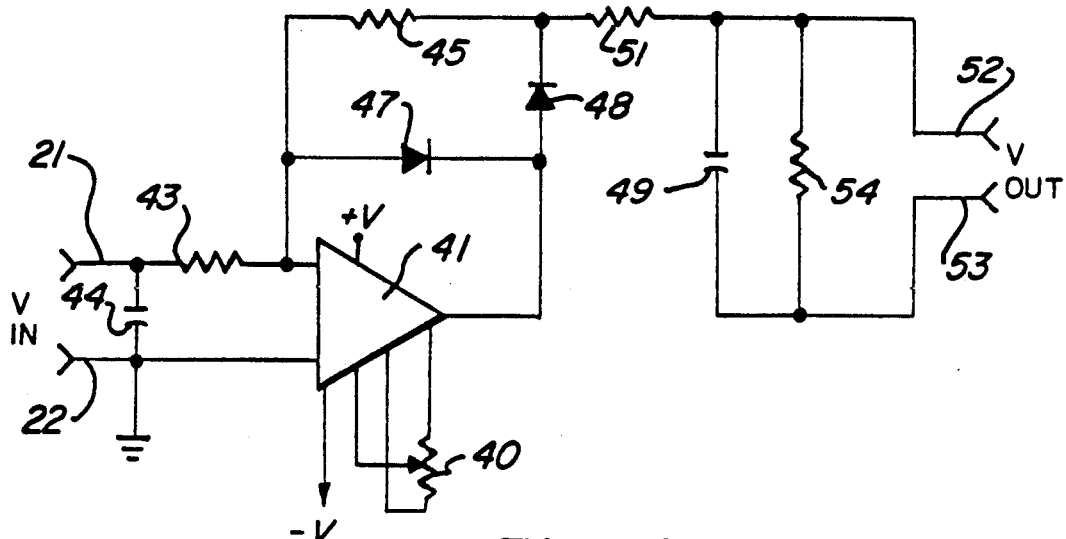
Fig_4
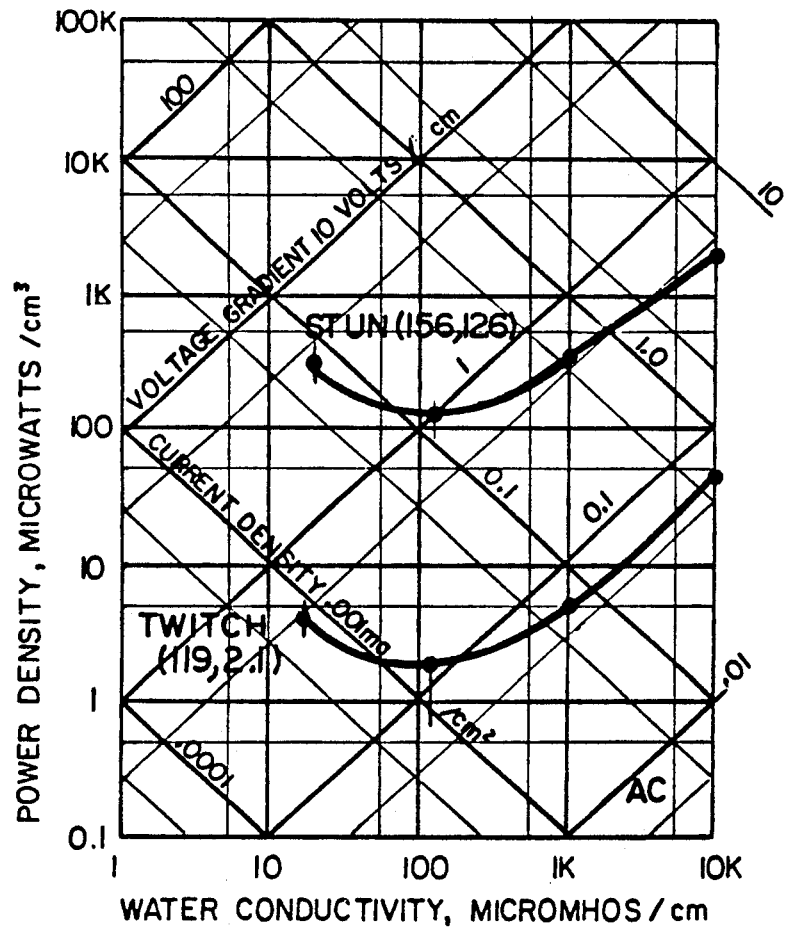
Fig_5
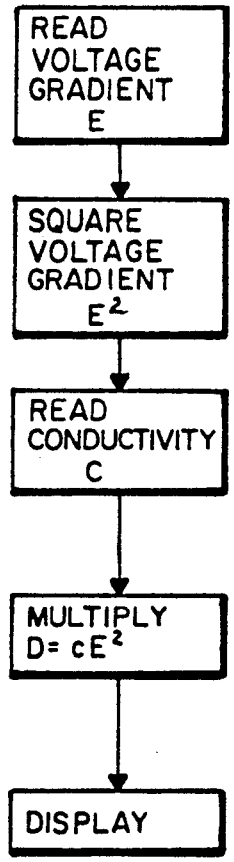
Fig_6

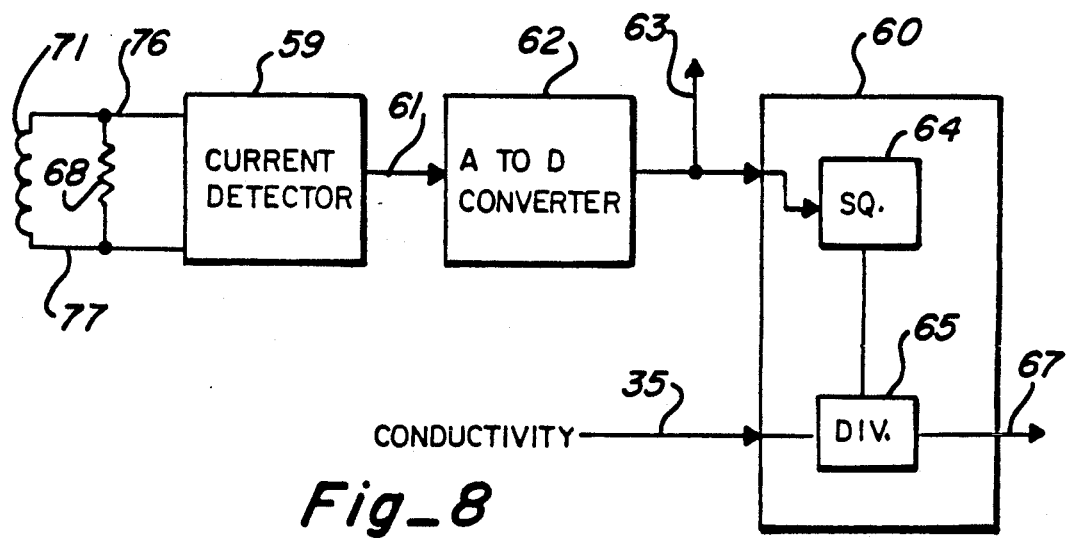
Fig_8
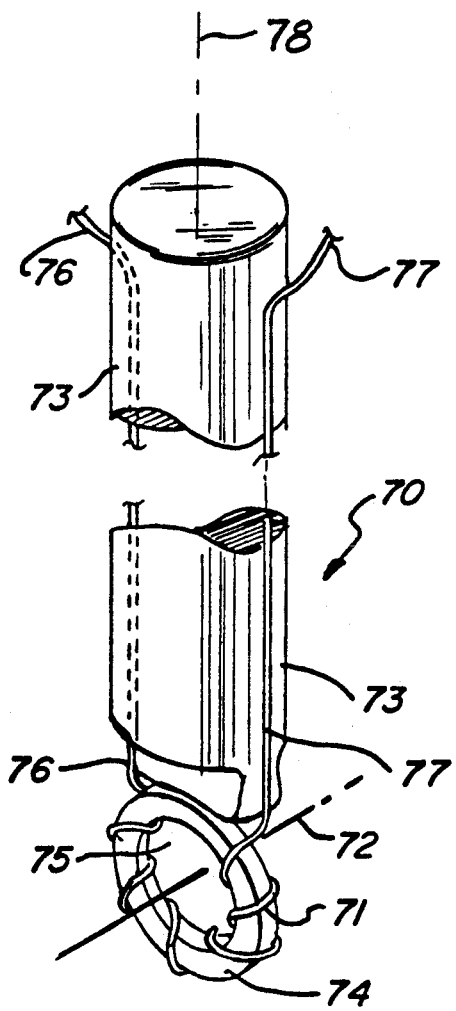
Fig_7
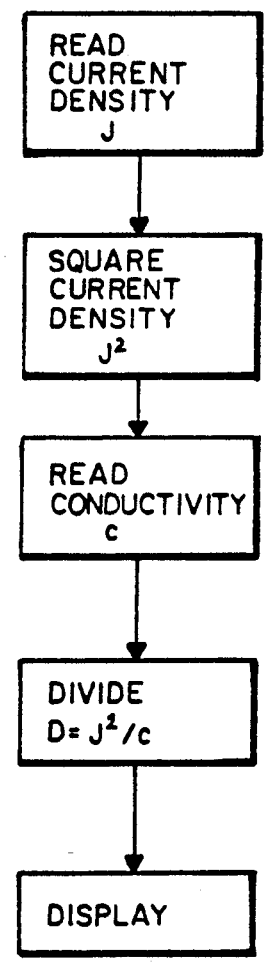
Fig_9

POWER DENSITY METHODS FOR ELECTROSHOCKING

This application is a divisional of Ser. No. 07/677,930, filed Apr. 1, 1991, now U.S. Pat. No. 5,202,638.

TECHNICAL FIELD

This invention relates to a novel and improved apparatus and method for measuring voltage gradient, current density and power density of an energized volume of liquid and particularly the power density of an energized body of water containing living organisms such as fish, aquatic mammals, invertebrates, etc. for use in determining optimal electrical power parameters for electrofishing, in-water electroshocking, electrical barrier control and the like.

BACKGROUND ART

The development of animal control measures using electroshocking techniques is of considerable interest. Electrofishing has gained prominence in recent years as a method for the capture and control of fish for research. Electrofishing involves the application of electric power through a volume of water containing fish. It has been determined that the magnitude of the electrical power that is transferred from the water into the fish determines the success or failure of the electrofishing operation. The electroshocking power is supplied from electric generators that produce either a direct current, sinusoidal alternating current, pulsed alternating current, or a pulse direct current into the water. Electroshock to a fish in a body of water can result in different responses including a twitch, an anodic attraction, a stun or complete tetany depending on the magnitude of the induced in-vivo power density.

The electrofishing literature discloses attempts to correlate current and voltage gradient measures in a body of water against the observed electroshock responses of fish. However, there are no known attempts to measure and then relate the significance of electric power density to the electroshock phenomenon.

Peters U.S. Pat. No. 2,625,588 discloses apparatus for measuring potential differences in a liquid body by providing an auxiliary path for the liquid together with a coil coupled to this path which has induced therein electromagnetic forces with the magnitude of these forces being indicative of the electric potential across the liquid.

Rezek U.S. Pat. No. 2,795,759, Medlar U.S. Pat. No. 2,780,781, Rezek U.S. Pat. No. 2,832,046 and Godshalk U.S. Pat. No. 2,802,182 disclose different types of instruments for measuring the density of current in a liquid body using a coil on a core immersed in a liquid bath.

Schainbaum U.S. Pat. No. 3,753,109 discloses a peak detector circuit in a different circuit arrangement.

A publication of the United States Department of the Interior, Fish and Wildlife Service, Technical Report 22 entitled "Electrofishing, A Power Related Phenomenon" of which the inventor of the subject application is an author discusses in detail electrofishing and related technical terminology.

DISCLOSURE OF THE INVENTION

Apparatus and method are disclosed for measuring the power density at specific locations within an energized volume of liquid including a probe for measuring the voltage gradients of the energized liquid body. The voltage gradient probe disclosed has a pair of electrodes spaced a selected distance apart from a center axis about which the electrodes are rotatable and the probe is designed with the center axis disposed upright and rotated about the center axis to a position of maximum voltage gradient. The probe measures the voltage gradient of a liquid body when immersed in the liquid body having an electric voltage applied thereto to energize the liquid body. A voltage detector is connected to the electrodes to detect a selected amplitude parameter of the measured voltage gradient such as the peak voltage, average voltage or RMS voltage and provide a first electric signal corresponding to the measured voltage. The measurement of peak voltage is considered the most descriptive for electrofishing.

A conductivity measuring means including a conductivity probe and a conductivity meter provides a second electric signal corresponding to the electric conductivity of the energized liquid body. A calculator receives both first and second signals and mathematically squares the magnitude of the first signal and multiplies the result with the second signal to provide an output signal that is a measure of the power density at a given location in the volume of the energized liquid. The measured power density may be displayed in a digital format. A graph that relates water conductivity, power density, voltage gradient and current density for a particular living organism is used to select the level of power density for electroshocking a particular organism.

BRIEF DESCRIPTION OF THE DRAWINGS

Details of this invention are described in connection with the accompanying drawings which like parts bear similar reference numerals in which:

FIG. 1 is a perspective view of measuring apparatus embodying features of the present invention.

FIG. 2 an enlarged perspective view of the probe for measuring the voltage gradient shown in FIG. 1.

FIG. 3 is a schematic circuit diagram of the measuring apparatus shown in FIG. 1.

FIG. 4 is a schematic electric circuit diagram showing a voltage peak detector.

FIG 5 is a graph showing the empirical electroshock response (body twitch and stun) for goldfish exposed to a 60 Hertz AC waveform for values of water conductivity ranging from about 20 to 10,000 micromhos/cm. All four scales of power density, water conductivity, voltage gradient and current density on the graph are logarithmic.

FIG. 6 is a flow chart of the program for a microprocessor for use as the calculator shown in FIG. 3.

FIG. 7 is a perspective view of a probe for measuring current density.

FIG. 8 is a schematic diagram of a measuring apparatus for measuring current density.

FIG. 9 is a flow chart of the program for the microprocessor for use as the calculator shown in FIG. 8.

DETAILED DESCRIPTION

As background for the present invention it has been found that the electrical power induced into a substance, organic or inorganic, immersed in water or any liquid conforms to the electrical theory for power transfer. The electrical power transferred from the liquid into the immersed substance may be determined from the maximum power transfer phenomenon, and the percentage of power transfer is controlled by the ratio of the electrical conductivity of the substance to that of the liquid. Thus, if electrical power density can be measured in the liquid, the amount of power transferred into a substance of known electrical conductivity can be calculated.

The effects of electroshock are power related and neither voltage or current measurements by themselves are conclusive in determining the intensity of electroshock. It is the magnitude of electrical power density transferred in-vivo to a fish that must be controlled when electrofishing. The concept of power transfer to a fish is developed herein from two theoretical approaches: circuit theory and electrical wave theory. Recognize that neither approach is absolute because the fusiform shape and complex electrical structure of a fish do not lend themselves to a mathematical solution, but the general electrical principles apply. The circuit theory is more easily understood, but wave theory better describes the electrical conditions that exist at the interface between the water and the fish.

The total electrical resistance required in Ohm's Law for any three-dimensional substance involves both the physical dimensions and electrical conductivity of the substance as given by the following equation:

$$\text{Total resistance } (R) = d/(cX) \text{ ohms}$$

where $d$ = length of material, $c$ = conductivity of material, and $X$ = cross-sectional area of material.

Considering an electrical circuit where a single, constant voltage, power source drives two electrical loads connected in series, one of the electrical loads ($R_1$) is held at a constant value while the second load ($R_2$) is changed. The electrical current for this series circuit is $$I = V/(R_1 + R_2) \text{ amperes.}$$

The electrical power delivered to the load $R_2$ can now be calculated by applying Joule's Law $$\text{Power (to } R_2) = [V/(R_1 + R_2)]^2 \times R_2$$

Equation 11 is rewritten, $$\text{Power (to } R_2) = qV^2/[R_1(1+q)^2]$$

where $q = R_2/R_1$ = mismatch ratio.

The maximum value of power (to $R_2$) can be determined by graphing the function or applying calculus: the peak of the curve is at $q = 1$. Thus, the maximum available power ($P_M$) can be obtained from this series circuit only when the two ohmic loads are equal. When $q = 1$, the maximum available power is $$P_M = V^2/(4 \times R_M)$$

where $R_M = R_1 = R_2$.

It is convenient to calculate the percentage of maximum power delivered to a load for arbitrary mismatch ratios. A normalized relation for this percentage is easily derived by dividing two of the above equations to get:

$$\text{Normalized power (\%)} = P(\text{to load})/P_M$$
$$= [4q/(1 + q)^2] \times 100$$

There is a maximum of power transfer when $R_1 = R_2$. As applied to electrofishing, maximum power is transferred to the fish when the fish manifests a resistive component equal to the resistance of the water. Although resistances of both the water and the fish are not controlled, the concept of maximum power transfer demonstrates a basic electrical principle that affects the transfer of power into the body of a fish.

The wave model for energy propagation is three dimensional and not restricted to wired circuits as previously used to conceptualize power transfer. In the wave model, it is recognized that applied energy at the boundary between two dissimilar media is either totally or partly transferred into the second medium or totally or partly reflected back into the first medium. Thus, three boundary conditions must be satisfied:

$$V_a = V_t + V_r$$

$$I_a = I_t - I_r$$

$$P_a = P_t + P_r.$$

These equations simply state that the voltage (V), current (I), and power (P) of the applied electrical energy (a) must be equal to the sum of the voltage, current, and power that is represented in the reflected energy (r) and transferred energy (t). The negative sign indicates that the reflected current is flowing in the opposite direction relative to the applied current. The goal is to derive a relation showing what portion of the applied power is transferred to the second medium when the conductivities of both media are known.

In any material conducting an electrical charge, the ratio of volts to current must equal the resistance of the medium (Ohm's Law). The resistance of a medium is given by $(R) = d/cX$ ohms when the conductivity is known for the material. Thus, when electrofishing, both the applied and reflected waves are passing through a resistance value determined by the conductivity of medium 1 (the water) and the transferred wave travels through a different resistive value as set by the conductivity of medium 2 (the fish). Hence, $$R_1 \text{ (the water)} = V_a/I_a$$
$$= V_r/I_r$$

and $$R_2 \text{ (the fish)} = V_t/I_t.$$

$$V_t = V_a - V_r = I_t \times R_2$$
$$= (I_a + I_r) \times R_2$$
$$= [(V_a/R_a) + (V_r/R_r)] \times R_2$$

and a rearrangement of terms yields $$V_r/V_a = (R_1 - R_2)/(R_1 + R_2)$$
$$= (1 - q)/(1 + q)$$

where $q$ is again the mismatch ratio.

The above equation shows the ratio between the reflected and applied voltages. It must now be recognized that the power in any medium (resistance considered constant) is always proportional to the square of the volts. Thus, the ratio of reflected power to applied power must be proportional to the square of the above equation:

$$P_r/P_a = [V_r/V_a]^2 32 [(1-q)/(1+q)]^2.$$

From the boundary equation:

$$P_t/P_a = [1 - (P_r/P_a)]$$

which can be written in terms of q by $$P_t/P_a = 4q/(1+q)^2.$$

The latter wave equation and the above derived equations for a series circuit can now be compared with the conclusion that power transfer from one medium to a second medium, under the conditions of propagating electrical energy, seems to be analogous to the circuit analysis where $P_t$ corresponds to the power in $R_2$ and $P_a$ corresponds to $P_M$ at the interface of the media. Thus the same power transfer criterion evolves, whether the solution is approached with circuit theory or with electrical wave theory.

Ohm's Law and the power equations previously described are given in terms of volts, current, and resistance. Most circuit analyses where the charge flow is confined to wires and circuit components (lamps, switches, motors, etc.) are based on these variables. In electrofishing, however, the electrical charge is moving freely through the water in three dimensions, and the electrical terms of volts, current, and power no longer adequately describe the phenomenon. Rather, electrical terms involving length, area, and volume are required. There are three new variables that are appropriate to electrofishing.

The equation $(R) = d/cX$ ohms can be used to calculate a resistance value (R) for any conductive medium (having known dimensions), and this equation can be substituted into Ohm's Law. It follows that $$V = I \times R = I \times [d/(cX)].$$

Rearranging the terms yields $$V/d = (1/c) \times (I/X).$$

Now one can define

Voltage gradient $(E) = V/d$ volts per centimeter and

Current density $(J)$ $= I/X$ amperes per square centimeter.

Substituting in the above equations yields relation known as the second form of Ohm's Law:

$$J = cE.$$

This second form of Ohm's Law enables the measurement of electrical variables relating to charge flow through a three-dimensional medium. In essence, a volume of material (water or fish) is considered as being composed of small cubic volumes. For each cube, a voltage exists across its length (voltage gradient), and an electrical charge passes through a surface area (current density). Furthermore, a power term—power density (D)—can be defined to describe the power dissipated per volume; its dimensions are watts per cubic centimeter (W/cm$^3$). An equation for power density is easily derived by simply noting that each cube has a volume equal to the length of a side (d) raised to the third power (d$^3$). Thus, $$D = P/d^3 = (V \times I)/d^3$$
$$= (V/d) \times (I/d^2) = E \times J \text{ W/cm}^3.$$

Two other relations for power density are formed using the above equations:

$$D = cE^2$$

$$D = J^2/c.$$

Referring now to FIG. 1 there is shown a liquid body B such as water. A device for applying electric power to the liquid body B to energize this liquid body is illustrated in FIG. 1 an electric power source 7 and two spaced electrodes 8 and 9 immersed in the liquid body B and electrically connected to the output of the power source by suitable electric power lines. For electrofishing it has been found that the electric power source may provide an output that is DC, pulsed DC, AC or pulsed AC. The configuration of the electrodes may vary from conductive rods to conductive plates having a variety of different shapes. Electrofishing apparatus may include a conductive plate affixed to or forming the bottom of the boat.

The measuring apparatus shown in FIGS. 1 and 2 includes a voltage gradient probe 12 for measuring the voltage gradient at a location within the volume of liquid B. The term used herein that is generic to both voltage gradient and current density is "a parameter for electrical field measurement". The probe 12 shown includes a non-conductive lower head portion 13 and a non-conductive upper handle portion 14 extending up from a central part of the head portion 13. The head portion 13 supports a pair of electrodes 15 and 16 spaced a selected distance apart designated "d". A distance d found suitable for electrofishing applications was 5 cm and 1 cm. The handle portion 14 is arranged along a center axis 18 so as to dispose the electrodes upright and provide for the manual rotation of the electrodes about the center axis 18 to orient the electrodes at a maximum voltage gradient. Each electrode 8, 9 forms equipotential surfaces surrounding that electrode. When the probe electrodes 15 and 16 are on the same equipotential surface there is no voltage gradient and when at right angles or orthogonal to an equipotential surface then this is a position of maximum voltage gradient. Voltage gradient is a vector quantity and may be comprised of both a vertical and horizontal component. A pair of insulated electric lines or conductors 21 and 22 are shown as connected at one end to electrodes 15 and 16, respectively, and extend along the handle.

As shown in FIG. 3, one input circuit of the measuring apparatus includes the voltage gradient probe 12 connected to the input of the voltage detector 25. The output of the voltage detector 25 is an analog signal that corresponds to voltage gradient (volts per centimeter)

designated E. The output signal from detector 25 is shown as applied to an analog to digital converter 26 that functions to convert the analog signal to a corresponding digital format. The output of the converter 26 is applied as one input to a calculator 27. The calculator performs the algebraic operation as indicated by the equation $D=cE^2$ and provides an output corresponding to power density at line 28. The results are displayed by display 29 in units of watts (or microwatts) per cubic centimeter. "c" is the electrical conductivity of the liquid body. This mathematical calculation can be performed with a dedicated microprocessor such as the SYM-1 microcomputer from Synertek, Inc. or with a calculator that has an RS 232 compatibility such as the Hewlett-Packard HP 48 SX.

Another input circuit of the measuring apparatus includes a water conductivity probe 31 and a conductivity meter 32 which measures conductivity in the liquid body B, in units of mhos (or micromhos) per centimeter. The output of the conductivity meter 32 at line 35 is applied as a second input signal to calculator 27. The calculator 27 shown has a squarer 36 and a multiplier 37. A suitable water conductivity probe and conductivity meter is the Model 1481-40 of Cole-Parmer Instrument Company. An alternative to probe 31 and meter 32 represented by block 33 is to use the reading from any water conductivity meter (analog or digital) and then provide manually operated switches for the second input to the power density calculator 27.

The voltage detector 25 shown in FIG. 4 detects peak voltages which have been found to be best suited for the electrofishing applications since fish appear to respond to peak voltage. This voltage peak detector 25 includes an operational amplifier 41 with plus and minus input ports supplied by input lines 21 and 22. A filter capacitor 44 is connected across the input lines and gain setting resistors 43 and 45 are connected to calibrate the amplitude of the applied input signal.

The voltage peak detector further includes a series diode 48 connected between the output of the operational amplifier and a voltage output line 52. A charge holding capacitor 49 connects to the diode 48 and across the output lines 52 and 53. A resistor 51 connects between the series diode 48 and output line 52. The charge holding capacitor 49 is shunted with resistor 54. An offset null potentiometer 40 is connected to three terminals of the amplifier 41. A diode 47 connects between the output of the amplifier 41 and the negative input terminal. A resistor 45 connects from diode 48 to the negative input terminal of amplifier 41. In operation, diode 48 is the current-control device which first conducts to charge the capacitor 49 and then becomes back-biased, permitting electrical charge storage in the capacitor. On a rising input the output will follow the positive peaks of the input as capacitor 49 charges through the conducting diode 48. On a falling input the stored charge in the capacitor will back-bias the diode 48 and the output will be a section of the exponential decay of the stored voltage. The end result is that the capacitor stores peak values of the input signal. It has been found that fish respond to the peak instantaneous power density of an applied voltage waveform rather than the average power density.

While the peak detector above described has been found suitable for fish, it is indicated that for other applications other measures of voltage may be more suitable such as detecting the average voltage or the RMS voltage.

By way of illustration and not limitation, the circuit values found suitable for the above described circuit are as follows:

| | |
|---|---|
| Capacitor 44 | .01 f |
| Resistor 43 | 4.7 Meg |
| V+ | +9V DC |
| V− | −9V DC |
| Operational Amplifier 41 | OP-77 |
| | Precision Monolithics Inc. |
| Potentiometer 40 | 20K |
| Diode 47 | IN 459 |
| Diode 48 | IN 459 |
| Resistor 45 | 1 Meg |
| Resistor 51 | 1K |
| Resistor 54 | 470K |
| Capacitor 49 | 1 f |

For a general measuring application, the above described apparatus may be used to measure voltage gradient output at line 24 and/or power density at output line 28 which is also readable on the display 29.

When measuring for the electrofishing applications, an empirical curve of the type shown in the graph FIG. 5 is used. Consider a value of water conductivity of 100 micromhos/cm and note from the curve that approximately 100 microwatts/cm$^3$ will be required to stun goldfish. The power density of the electrofishing apparatus 7, 8 and 9 is adjusted to a threshold of 100 microwatts/cm$^3$ to effectively stun the goldfish.

Referring to FIGS. 7-9, there is shown apparatus for measuring current density in a volume of electrified liquid. This apparatus includes a probe 70 which has a coil 71 with a selected number of turns or coils of conductive magnet wire wound around a ferromagnetic core 74 in the form of a toroid that is supported at the end of a non-conductive tubular handle 73. The axis 72 of the core 74 is in an orthogonal plane to the axis 78 of the handle 73. In use, the probe 70 is immersed in a volume of liquid and rotated to a position of maximum electrical signal as generated by coil transformer action via lines 76 and 77 into the resistance input of resistor 68 of operational amplifier 41. The magnitude of this electrical signal is a measure of the electrical charge passing through the area 75 encompassed by the inside diameter of the core 74. The gain setting resistors 43 and 45 are adjusted such that the output at line 61 of the current detector 59 produces an electrical signal directly proportional to electrical charge per area which is the actual measurement of current density. The output signal from detector 59 is applied to an analog to digital converter 62 that functions to convert the analog signal to a digital format that appears at output line 63. The output of the converter 62 is applied as one input to calculator 60. The calculator 60 mathematically squares the measure of current density by squarer 64 and divides by divider 65 this squared value by the conductivity to give an output signal over line 67 that is a determination of power density. The necessary modification to the voltage detector (FIG. 4) to form a current detector is the addition of an input resistor 68 in parallel with capacitor 44 and different selected values for gain setting resistors 43 and 45.

Although the present invention has been described with a certain degree of particularity, it is understood that the present disclosure has been made by way of example and that changes in details of structure may be made without departing from the spirit thereof.

What is claimed is:

1. A method for electroshocking a selected living organism comprising the steps of:
    applying electric power to a liquid body having a living organism to energize said liquid body and living organism,
    measuring the power density and electrical conductivity of said energized liquid body, and
    adjusting the electric power applied to said liquid body and living organism according to a graph on a plot of electrical conductivity and power density based on transferring the optimal amount of electrical power into the body of a living organism to evoke a particular electroshock response from a selected living organism to accomplish a shocking effect for the selected living organism.

2. A method for electroshocking a selected living organism comprising the steps of:
    applying electric power to a liquid body having a living organism to energize said liquid body and living organism,
    measuring the power density and electrical conductivity of said liquid body, and
    adjusting the electric power applied to said liquid body and living organism according to a curve on a plot of electrical conductivity and power density based on transferring the optimal amount of electrical power into the body of a living organism to evoke a particular electroshock response from said selected living organism.

3. A method for electroshocking a selected living organism comprising the steps of:
    establishing an electric field in a liquid body having a living organism,
    measuring the power density and electrical conductivity of said liquid body, and
    adjusting the electric power applied to said liquid body and living organism according to a curve on a plot of electrical conductivity and power density based on transferring the optimal amount of electrical power into the body of a living organism to evoke a particular electroshock response from said selected living organism.

4. A method for electroshocking a selected living organism comprising the steps of:
    applying electric power to a liquid body having a living organism to energize said liquid body and living organism,
    measuring the voltage gradient and electrical conductivity of said liquid body, and
    adjusting the electric power applied to said liquid body and living organism according to a curve on a plot of electric conductivity and voltage gradient based on transferring the optimal amount of electric power into the body of a living organisms to evoke a particular electroshock response from said selected living organism.

5. A method as set forth in claim 4 wherein said measurement of voltage gradient is accomplished by moving a voltage gradient probe in the energized liquid body to a position of maximum voltage gradient.

6. A method for electroshocking a selected living organism comprising the steps of:
    applying electric power to a liquid body having a living organism to energize said liquid body and living organism.
    measuring the current density and electrical conductivity of said liquid body, and
    adjusting the electric power applied to said liquid body and living organism according to a curve on a plot of electric conductivity and current density based on transferring the optimal amount of electric power into the body of a living organism to evoke a particular electroshock response from said selected living organism.

7. A method as set forth in claim 6 wherein said measurement of current density is accomplished by moving a current density probe in the energized liquid body to a position of maximum current density.

* * * * *